(12) United States Patent
Dove

(10) Patent No.: US 8,659,059 B2
(45) Date of Patent: Feb. 25, 2014

(54) STRAINED TRANSISTOR STRUCTURE

(75) Inventor: Barry Dove, Coppell, TX (US)

(73) Assignee: STMicroelectronics, Inc., Coppell, TX (US)

( * ) Notice: Subject to any disclaimer, the term of this patent is extended or adjusted under 35 U.S.C. 154(b) by 36 days.

(21) Appl. No.: 13/341,592

(22) Filed: Dec. 30, 2011

(65) Prior Publication Data

US 2013/0168743 A1    Jul. 4, 2013

(51) Int. Cl.
  *H01L 29/76* (2006.01)
(52) U.S. Cl.
  USPC .............. 257/288; 257/E27.06; 257/E27.028; 257/E29.04

(58) Field of Classification Search
  CPC ............ H01L 29/6659; H01L 29/7833; H01L 21/823807
  USPC ................ 257/288, 327, 344, 347, E27.06, 257/E29.028, E29.04
  See application file for complete search history.

(56) References Cited

U.S. PATENT DOCUMENTS

| 4,143,388 | A  | * | 3/1979 | Esaki et al. ................... | 257/327 |
| 6,417,543 | B1 | * | 7/2002 | Yamazaki et al. ............ | 257/347 |
| 2010/0164000 | A1 | * | 7/2010 | Dove ............................ | 257/368 |

* cited by examiner

*Primary Examiner* — Nikolay Yushin
(74) *Attorney, Agent, or Firm* — Seed IP Law Group PLLC

(57) ABSTRACT

A strain enhanced transistor is provided having a strain inducing layer overlying a gate electrode. The gate electrode has sloped sidewalls over the channel region of the transistor.

10 Claims, 8 Drawing Sheets

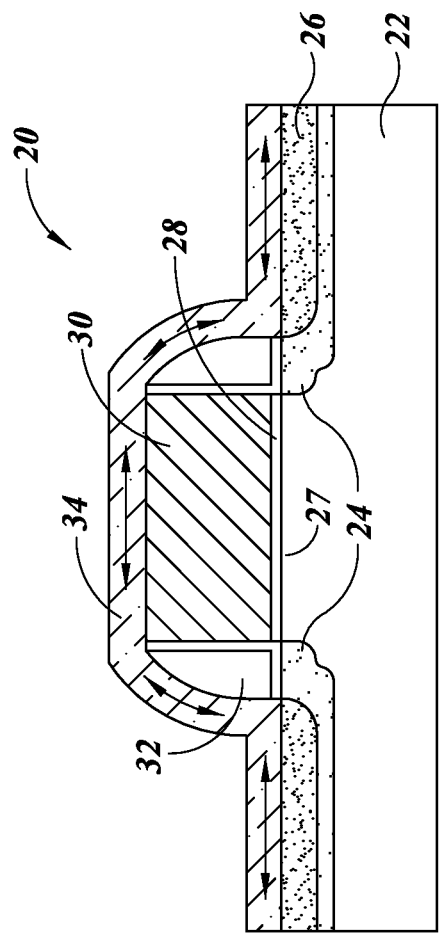
FIG.1 *(Prior Art)*

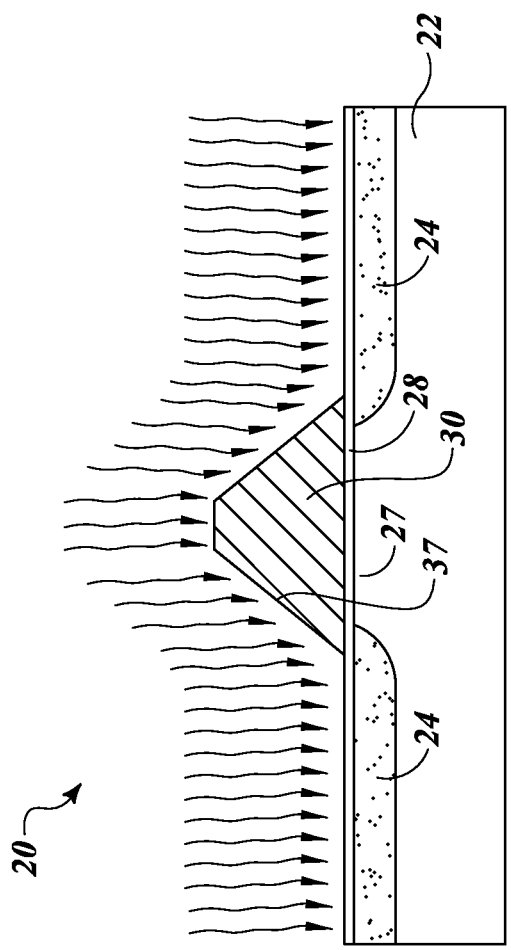

STRAINED TRANSISTOR STRUCTURE

BACKGROUND

1. Technical Field

The present disclosure relates to the field of integrated circuit design. The present disclosure relates more particularly to formation of strain inducing structures in a transistor.

2. Description of the Related Art

Integrated circuits generally include many transistors formed at the surface of a semiconductor substrate. Since the advent of integrated circuits, there has been a continuous scaling of transistor size to enable putting more transistors in a smaller area of the semiconductor substrate. This scaling has allowed integrated circuits to contain more complex circuits in a same area and thus decrease cost. Additionally, as transistors decrease in size, the switching speed increases, thus improving performance.

However, as the size of transistors has continued to shrink, so has the distance separating transistors from one another. This shrinking of the separation distance has produced undesired effects in transistor performance. In particular electric fields generated in one transistor more readily affect the performance of an adjacent transistor. This effect can degrade the performance of individual transistors and on a large scale can affect the performance of the integrated circuit as a whole. Additionally, leakage currents develop between adjacent transistors, affecting performance and using power. This extra power usage is uneconomical and also can heat the chip, further adversely affecting the chip.

To reduce these leakage currents, field oxide regions have been placed between transistor regions. At one time the field oxide regions were a barrier of silicon oxide with a portion above and a portion below the surface of the substrate formed by local oxidation of silicon (LOCOS).

But as transistor size has further shrunk, other techniques for isolating adjacent transistors have arisen. In particular, shallow trench isolation (STI) has been utilized to isolate adjacent transistors from each other. In STI processing, a portion of the silicon substrate between adjacent transistors is etched to form a trench in the substrate. The trench is then filled with a dielectric material which serves to inhibit leakage currents between the adjacent transistors.

Scaling of transistor size has served to improve switching speed (the maximum speed at which a transistor can be switched off or on), conduction properties, and circuit density. However as CMOS technology has reached the 32 nm and 16 nm nodes, scaling has become more difficult and new techniques for improving device function have been sought.

One technique for improving transistor properties is to introduce strain on the channel of the transistor. This has been done in the past by carefully forming strain inducing layers of materials in the substrate near the channel, and also overlying the gate electrode of the transistor. The strain inducing layers induce either a tensile or compressive strain on the channel region of the transistor, according to the type of the transistor, and in so doing improve carrier mobility in the channel region. The improved carrier mobility enhances current conduction in the channel region, which in turn allows for lower power dissipation and enhanced transconductance. The enhanced transconductance means that a larger current can be induced in the channel with a smaller gate to source voltage, allowing for lower supply voltages to be used on chip. The lower supply voltages allow for further reduction of power dissipation.

FIG. 1 is a cross section of a conventional strained transistor 20. The transistor is formed in a monocrystalline semiconductor substrate 22. Lightly doped source and drain regions 24 are formed in the monocrystalline semiconductor substrate 22. Heavily doped source and drain regions 26 are also formed in the monocrystalline semiconductor substrate 22. A transistor channel region 27 is positioned in the monocrystalline semiconductor substrate 22 between the lightly doped source and drain regions 24. A gate oxide 28 is on the surface of the monocrystalline semiconductor substrate 22 overlying the channel region 27. A gate electrode 30 having vertical sidewalls is positioned on the gate oxide 28. Sidewall spacers 32 are positioned adjacent the vertical sidewalls of the gate electrode 30.

A strain inducing dielectric layer 34 is deposited overlying the gate electrode 30, the sidewall spacers 32, and the source/drain regions 26. For an N-type transistor, the strain inducing layer 34 is a silicon nitride layer having a compressive stress. For a P-type transistor the strain inducing layer 34 is a silicon nitride layer having a tensile stress. The strain inducing layer 34 can be deposited having the desired magnitude of compressive stress or tensile stress as is known in the art in order to achieve some level of stress within the channel region 27.

Force arrows are drawn in the strain inducing layer 34 to show one of the directions of stress in the various parts of the strain inducing layer 34. For horizontal portions of the stress inducing layer 34, there is compressive or tensile stress is in the horizontal direction. (There may be compressive stress in other directions, but for purposes of this study, these directions are of the most interest.) For the portions of the stress inducing layer 34 formed over the sidewall spacers 32, the stress is primarily in the vertical direction, with a small horizontal component.

BRIEF SUMMARY

One embodiment is a transistor formed on a monocrystalline semiconductor substrate. The transistor includes a gate electrode having sloped sidewalls over the channel region of the transistor. A strain inducing layer is formed over the gate electrode conformal with the surface of the gate electrode. The strain inducing layer induces strain in the channel region of the transistor.

In one embodiment the transistor includes lightly doped drain regions adjacent the channel region of the transistor. The lightly doped drain regions are formed by ion implantation of impurity atoms into the monocrystalline semiconductor substrate. Impurity atoms are also implanted through the gate electrode into the portions of the channel region below the thinner portions of the slanted sidewalls of the gate electrode. As the vertical thickness of the sloped sidewalls decreases, a higher concentration of dopant atoms is implanted into the channel region. This creates a dopant concentration gradient near the edges of the channel region adjacent the lightly doped drain regions.

In one embodiment the gate electrode is polysilicon and the strain inducing layer is silicon nitride. In one embodiment the sloped sidewalls of the gate electrode are formed by wet etching the polysilicon gate electrode followed by a partial dry etch. In one embodiment the sloped sidewalls are formed by alternating between wet etch and dry etch. In one embodiment the sloped sidewalls are formed by wet/dry etch hybrid.

BRIEF DESCRIPTION OF THE SEVERAL VIEWS OF THE DRAWINGS

FIG. 1 is a cross section a conventional transistor.

FIGS. 2A-2E is a cross section of a strained transistor at various stages of manufacture according to one embodiment.

DETAILED DESCRIPTION

Figure 2A:
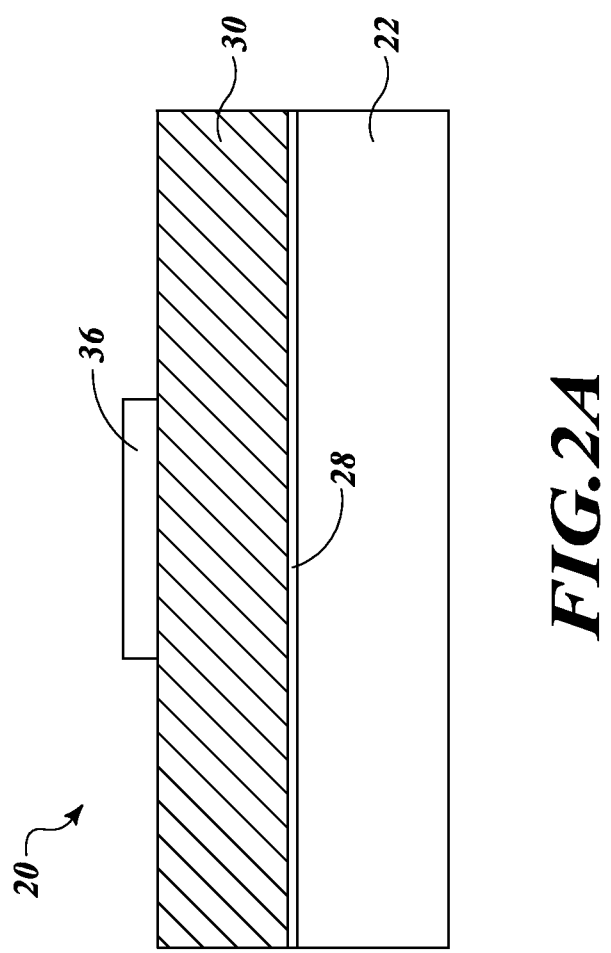

FIG. 2A is a cross section of transistor 20 at an intermediate stage of manufacture according to one embodiment. A gate dielectric 28 is positioned on a monocrystalline semiconductor substrate 22. A gate electrode 30 is positioned on the gate dielectric 28. A mask 36 is positioned on the gate electrode 30. The mask 36 can be made by any acceptable techniques such as pattern and etch of photoresist, a hard mask of an oxide, a nitride, or the like. The photoresist structure 36 is patterned to enable formation of the gate electrode 30 in a desired final size shape, as will now be explained.

In one embodiment the monocrystalline semiconductor substrate 22 is a monocrystalline silicon substrate. The gate dielectric 28 is a silicon dioxide layer between 10 Å and 40 Å thick. The gate electrode 30 is polysilicon between 100 nm and 500 nm thick. The monocrystalline semiconductor substrate 22 can be any suitable semiconductor material. The monocrystalline semiconductor substrate 22 can include germanium, silicon germanium, gallium arsenide, sapphire, or any other suitable monocrystalline semiconductor material. The gate dielectric 28 can be a dielectric material other than silicon dioxide. For example the gate dielectric 28 can include an oxynitride, a nitride layer, a high-k dielectric such as hafnium or any other suitable material. The gate dielectric 28 can have a thickness other than those described previously. The gate electrode 30 can be of a material other than polysilicon. Metal gate electrodes can also be used, such as aluminum, tungsten, tantalum, nickel silicide, titanium silicide, tungsten silicide, or any other suitable gate electrode material. The thickness of the gate electrode 30 can be thicker or thinner than described previously, according to the desired application and processing parameters.

Figure 2B:
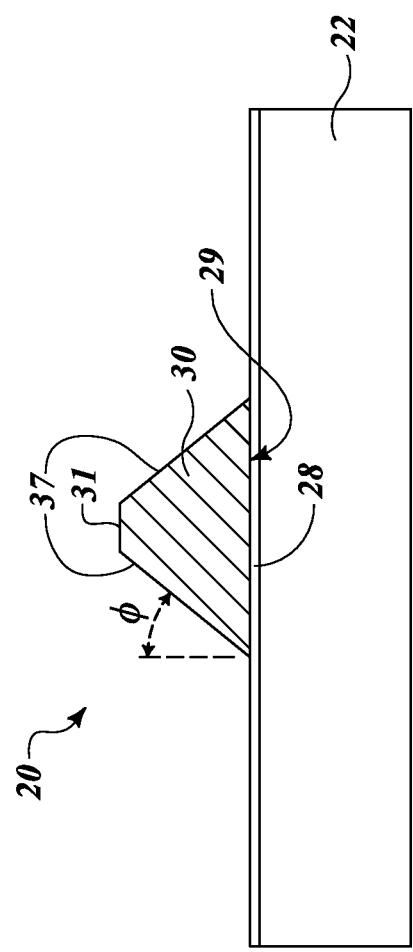

In FIG. 2B the gate electrode 30 has been patterned and etched to form a gate electrode 30 with sloped sidewalls 37. The sloped sidewalls 37 of the polysilicon gate electrode 30 can be formed in any suitable way. In one example, the sloped sidewalls 37 are formed by subjecting the polysilicon gate electrode 30 to an etching process that etches the polysilicon in the vertical direction and also having a particular selectivity with respect to the horizontal direction. The slope of the sidewalls 37 is based in part on the chemical makeup of the etching material, or on the process used to perform the etch.

In one embodiment the gate electrode is etched using a wet etch followed by a partial dry etch. The wet etch can include etching with a mixture of nitric acid, water, and hydrofluoric acid. The dry etch can include plasma etching or reactive ion etching. In order to obtain the desired slope, the etching of the polysilicon gate electrode 30 can include alternating between wet etch and dry etching multiple times, or can even include a wet etch/dry etch hybrid. Alternatively, the gate electrode 30 can be etched with a chemical which etches in the vertical direction with a desired selectivity relative to etching in the horizontal direction. In this way, a desired angle Ø of the sloped sidewalls 37 of the gate electrode 30 can be chosen. The gate electrode 30 can also be etched using an anisotropic etch which can produce a gate electrode having sidewalls 37 having a variable slope with respect to the vertical direction. There are many well-known techniques widely published in the semiconductor art to etch silicon to create a slope of the type shown, and therefore the full details of the etch chemistries that could be used need not be provided here. Any suitable etching method can used.

When a material other than polysilicon is used for the gate electrode 30, any suitable chemicals or etching methods can be used to select the desired angle Ø of the sloped sidewalls 37 of the gate electrode 30. The initial thickness of the gate electrode 30 can be selected to facilitate etching of the gate electrode 30 in the desired shape and angle Ø.

In one embodiment, the angle Ø of the sloped sidewalls 37 of the gate electrode 30 is between 45 degrees and 70 degrees relative to the surface of the monocrystalline silicon substrate 22. Alternatively, the slope of the sidewalls of the gate electrode 30 may fall outside of this range according to the desired application. Also, an embodiment may have a gate electrode 30 in which one sidewall has a different slope than the other, such the gate electrode 30 is not symmetric. In another embodiment, one sidewall of the gate electrode 30 may be sloped while an opposite other sidewall is not sloped (e.g., generally vertical).

The gate electrode will have a length "L" that generally corresponds to the channel length at the bottom surface 29 abutting the gate dielectric. In transistors, the channel length is measured as the distance between the source and drain regions, in the substrate. Therefore, the length of the gate is also expressed in this application as the distance the gate extends from the source to the drain overlying the channel region. The gate electrode slopes inward from the bottom surface 29 that abuts the gate electrode to the top surface 31 that has a length shorter than the bottom surface 29. The etching can be selected to remove material at any desired slope to obtain a desired length "L" at the bottom.

In one embodiment, the mask layer 36 remains present during the entire etch process. Depending on the etch used, the length of the top 31 is determined by the length of the mask and the bottom 29 is wider than mask 36 since the sidewalls slope. In another embodiment, the etch is first primarily anisotropically to achieve a bottom 29 having a length about equal to the mask length 36, after this a more isotropic type etch is carried out that undercuts the mask 36 to create the sloped sidewalls 37 so the top 31 is much shorter than the mask 36.

In another embodiment, after the first phase of the etch is compete with the mask 36 present, the mask is then removed and the layer 30 is subjected to an isotropic etch in which the length of the bottom 29 and the top 31 are reduced an equal amount. The slope remains the same angle but the overall channel length is reduced since the bottom length 29 gets shorter, resulting in a short channel length.

In the figures shown, the sidewall 37 is depicted as a generally straight slope, extending as a straight line, from the bottom 29 to the top 31. In most embodiments, the sidewalls 37 will have some curvature, with a slight arc, either concave or convex, depending on the etch chemistry, as they extend from the bottom 29 to the top 31.

As shown in FIG. 2C ion implantation is performed to form lightly doped drain regions 24. As in conventional transistors, the lightly doped drain region is formed by implanting ions through the gate dielectric 28 into the monocrystalline silicon substrate 22 adjacent the channel region 27.

In one embodiment, the transistor 20 of FIG. 2C has an advantage in that the sloped sidewalls 37 of the gate electrode 30 create regions of small vertical thickness of the gate electrode 30 near the bottom corners of the gate electrode 30. Thus when ion implantation is performed, ions are implanted through the thinner portions of the gate electrode 30 near the corners of the gate electrode 30 into the channel region 27 below the gate electrode 30 in the monocrystalline silicon substrate 22. Thus near the edges of the channel region 27 there is a higher dopant concentration than towards the middle of the channel region 27 below the central region of the gate electrode 30. Thus, in one embodiment, at the very edges of the gate electrode, a light dopant concentration is implanted. In this embodiment, the implant power is adjusted to have enough power to only implant through the edges of the gate electrode and not at any other regions. In other embodiments, the implant power is increased, to implant to a greater depth and thus create a gradient along the length of the gate electrode. Therefore, in this other embodiment a dopant concentration gradient is formed along the length of the gate electrode below the sloped sidewalls 37 of the gate electrode 30 inversely proportional to the vertical thickness of the gate electrode 30 above the channel region 27. This can enhance overall performance of the transistor 20. Directly below the central region of the gate electrode 30 in the channel region 27, no ions, or perhaps only a very few, will be implanted because the thickness at the central region of the gate electrode 30 is too large for ions to pass through during implantation in one embodiment.

In one embodiment, a preferred LDD implant is very shallow in some transistor designs, and is the most shallow at the edge of the channel region. This particular gate electrode design provides the ability to customize the length of the channel based on selecting the implant power. If a slightly narrower channel is desired, the implant power used for the LDD implant can be increased to go through a thicker part of the gate electrode and reach the substrate instead of just at the edge of the gate electrode. Thus, the implant power can be selected to cause the ions implanted in the LDD step to pass through gate electrode to the substrate at locations where it has about 50% to 60% of its total thickness. The central region, namely, those regions where the thickness is greater than 60% of the total height from the bottom to the top, will block the LDD implant to keep it from entering the substrate. The channel length with therefore, in this embodiment, be defined by the amount of power used in doing the LDD implant. \

In the prior art, the channel length has been only able to be defined by using photolithographic techniques based on how narrow of a line width could be made with the available imaging tools, photoresist and various optical techniques, After the gate electrode was formed, LDD implants were formed using the gate electrode as a mask and thus the LDD implants entered the substrate directly adjacent the sidewall of the gate electrode. The substrate was then annealed, causing the LDD implants to diffuse a short distance in the substrate and extend a short distance under the gate electrode and also deeper down into the substrate. If the anneal time was extended for a longer period of time, the implant would extend further under the gate electrode, resulting in a shorter channel length. The downside was that the longer anneal would also cause the LDD implant, and all other implants that had been made at to that point, to diffuse in all directions, including deeper into the substrate. As the LDD implant, and other implants go deeper into the substrate, transistor performance degrades, greater parasitic effects occur, latch-up issues increase, along with other problems. Thus, the thermal budget of a semiconductor substrate was carefully monitored and limited to avoid the LDD implant, as well as other implants, from spreading to deep and to far into undesired regions. Furthermore, with a constant height of the gate electrode, if the implant power is increased enough to cause some of the implanted ions to pass through any of the gate electrode, the entire channel would be implanted. Therefore, the standard transistor design does not permit variations in the implant power to affect the channel length and this is limited to the capabilities of the photolithographic tools and optical techniques.

In this alternative embodiment, however, with the sloped gate electrode, the implant power can adjusted to cause the ions to go through only a selected portion of the gate electrode and still be very shallow in the substrate. With a very short anneal that causes almost no lateral or vertical diffusion, the implant can be activated. In the prior art, the anneal time and temperature had to be sufficient to cause some portion of the LDD implant to spread under the gate as it diffused, but in this embodiment, since some the implant is under the gate electrode as initially placed, the anneal time and temperature only needs to be sufficient to activate the ions and not to diffuse them. The channel length can therefore be made very short, for example, 20 nm, 10 nm, or even less when the length of the mask 36 is much greater, for example 45 nm. In one further alternative embodiment, if the LDD implant is under a portion of the gate electrode, for example 50% of the gate electrode, (25% from each side), then it is possible for the heavy source drain implant that follows to use the full gate electrode as the blocking mask so that a sidewall spacer is not needed, or a less thick sidewall spacer is needed and the overall transistor length, from the most distal end of the source region to the most distal end of the drain region can be much shorter than is permitted in the prior art.

Further, the particular shape of the gate electrode permits the ability to perform different LDD implants of different implant powers and at different doses. A first LDD implant can have a very low dose and a high implant power to enter a larger amount of substrate under the gate electrode. A second LDD implant can have a slight higher dose, but a lower implant power so that is blocked by more of the gate electrode and penetrates in the substrate for some of the region under the gate electrode, but not as much, nor as deep as the first implant, and, in some regions, it remains quite shallow where it has barely enough power to pass through the gate electrode and into the upper most surface of the substrate. If desired, a third LDD implant can be made of yet a slightly higher dose and even lower power, though in some embodiments, only two LDD implants, each at a different dose and different power are used. In this way, a graded LDD implant can be made, a feature that provide significant performance benefits in some transistor designs and that was achieved in the prior art only by forming two or more sidewall spacers, one for each LDD implant and described in various prior art patents.

Figure 2D:
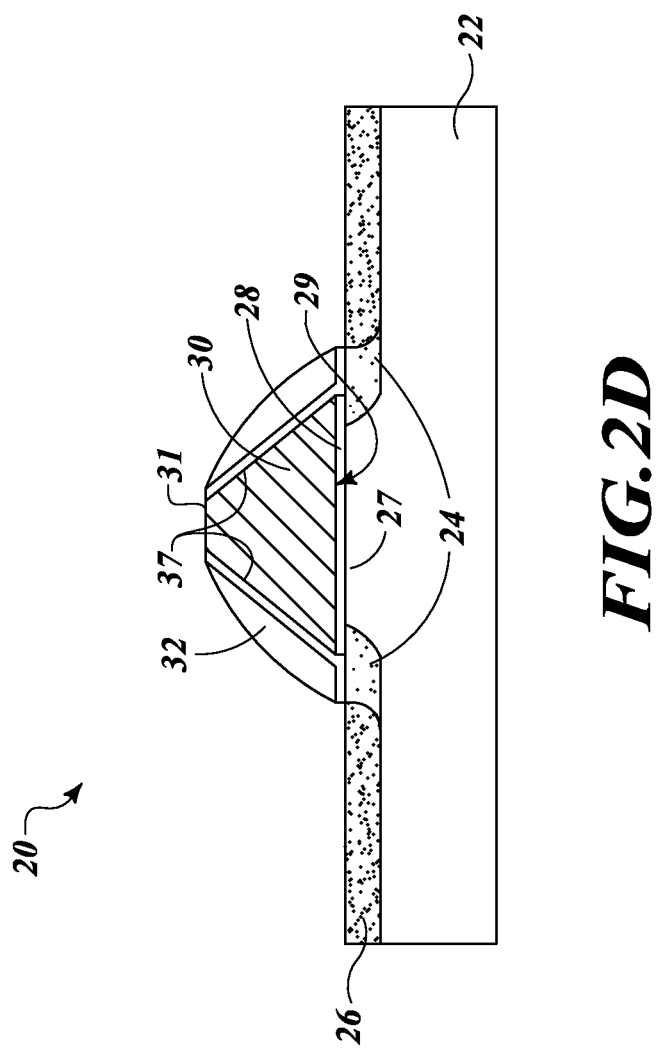

Next, as shown in FIG. 2D, sidewall spacers 32 are formed according to conventional processes. The sidewall spacers 32 differ from conventional sidewall spacers only in that they are formed on the sloped sidewalls 37 of the gate electrode 30. Because the sidewall spacers 32 are formed on the sloped sidewalls 37 of the gate electrode 30, the sidewall spacers 32 are also sloped in a similar manner. Heavily doped source and drain regions 26 are then formed by ion implantation after the sidewall spacers 32 have been formed.

Figure 2E:
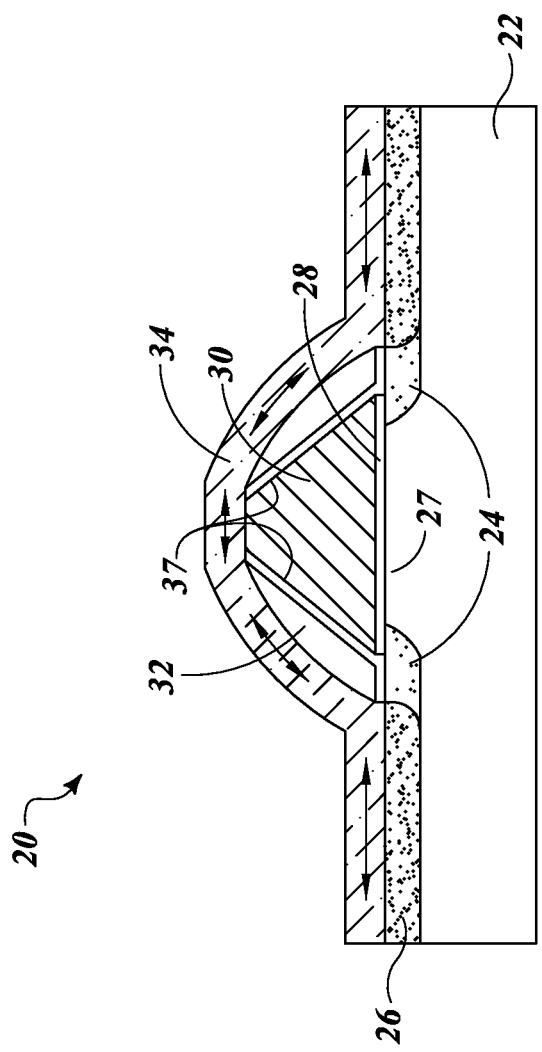

In FIG. 2E a strain-inducing layer 34 is conformally deposited over the gate electrode 30, the sidewall spacers 32, and the source/drain regions 26. The strain-inducing layer 34 is deposited as a conformal layer having a generally uniform thickness. In one embodiment, the strain-inducing layer 34 is silicon nitride. In other embodiments, the strain-inducing layer 34 includes a silicon dioxide, a silicon oxynitride, or other conformally deposited dielectric layers in some embodiments alternating with each other. The formation of silicon nitride, silicon dioxide, or silicon oxynitride as conformal strain-inducing layers, a laminated layer, having various sublayers is carried out to achieve a desired amount of stress on the channel region 27.

A silicon nitride can be deposited to exhibit compressive stress or tensile stress. In the case of silicon nitride, for example, a deposition by plasma enhanced chemical vapor deposition (PECVD) in which a bias power supply to the plasma atmosphere is used, the amount of power may be varied to adjust the mechanical stress creating the silicon nitride layer as it is deposited. For example, a deposition may be performed using well-established process recipes to create a compressive stress in silicon nitride of approximately 150 MPa with a moderately high bias power. Additionally, using other well-established deposition recipes, silicon nitride can be deposited with a tensile stress of approximately 30-1,000 MPa in order to exert the tensile stress on the substrate. In general, the stress created in the silicon nitride during the deposition process depends on the gas mixture, the deposition rate, the temperature and the ion bombardment. According to well-known process recipes, the corresponding amount of tensile or compressive stress in the layer may be adjusted by, for instance, varying the amount of the process parameters to create the desired tensile or compressive stress in the silicon nitride layer itself. $Si_3N_4$ can be formed by PECVD in a chamber in the presence of silane ($SiH_4$), $N_2$, and ammonia ($NH_3$). By varying the silane flow rate, the ammonia flow rate, the $N_2$ flow rate, the pressure, temperature (both before and after deposition), and the low and high frequency power outputs in the deposition chamber, a silicon nitride layer can be made to have varying levels of compressive or tensile strain. Methods for forming silicon nitride layers having a selected level of strain are well known by those of skill in the art and are not further detailed here.

According to one embodiment, a thickness in the range of 50-100 nm is used, with some variation depending on the number of layers or sublayers in the laminate. In another embodiment, the thickness is preferable in the range of 10-15 nm and is limited to be less than 20 nm. This thinner strain-inducing layer 24 is used when a shallow channel and shallow source/drain regions are present, as are common in some technologies having very shallow source/drain implants.

When straining a transistor gate channel using a strain inducing layer 34, the strain inducing layer 34 that goes over the top of the gate electrode 30 is primarily for inducing a strain in a direction parallel with the substrate surface below the gate electrode 30; for example, in the channel region 27. In a conventional transistor structure as shown in FIG. 1, the gate electrode 30 has substantially vertical sidewalls, which affects the shape of the conformal strain inducing layer 34. One conventional method for increasing the strain in the channel region 27 is to make the strain inducing layer 34 thicker, but making the strain inducing layer 34 thicker can have adverse consequences. The adverse consequences can include requiring longer contacts which require greater etch times, greater deposition time, and more metal usage. Using more metal increases the cost. Furthermore, strain inducing material is typically not a low-k material. It is often desirous to use low-k dielectric materials above the transistor 20 and between metal lines in an integrated circuit to reduce the parasitic capacitance between conducting components of an integrated circuit die. Therefore having a thick strain inducing layer can increase parasitic capacitance. This can also cause greater strain in other areas where strain may not be needed or desired. This can lead to a greater risk of cracking in some areas, which can also cause failures.

The transistor 20 of FIG. 2E has a gate electrode 30 with sloped sidewalls 37 and can provide for increased strain in the channel region 27 delivered by a strain inducing layer 34 of a given thickness. By sloping the sidewalls of the gate electrode at the region where the gate channel strain is desired, a strain inducing layer of a given thickness can have a greater total effect of strain on the gate channel 27 in a direction parallel with the surface of the monocrystalline silicon substrate 22 below the gate electrode 30, as compared to a transistor in which the sidewalls of the gate electrode 30 are substantially vertical at such areas of interest such as at the channel 27. The greater the slope, i.e., the angle Ø with respect to vertical the better the strain can be distributed in the channel region 27. This is illustrated by the force arrows drawn in the strain inducing layer 34 of FIG. 2E. There is a greater horizontal component of the force vector over the sloped sidewalls 37 of FIG. 2E than the force vectors over the straight sidewalls in FIG. 1. The horizontal component of the force vector in the strain inducing layer 34 on the gate electrode 30 is larger than over the sloped sidewalls 37. This effectively gives greater force on the channel region 27 from the straining layer 34 while maintaining the cross-sectional area of the gate electrode 30 needed to prevent higher resistance that would otherwise be caused by the reduced height of a rectangular gate electrode.

The result of the improved horizontal forced distribution of the strain inducing layer over the sloped sidewalls 37 of the gate electrode 30 is that the channel region 27 will have a higher conductivity when the transistor 20 is in a conducting condition. This allows for a reduced current consumption as well as permitting reduced supply voltages. By reducing the supply voltages, power losses from hot ion injection can be reduced.

Figure 3:
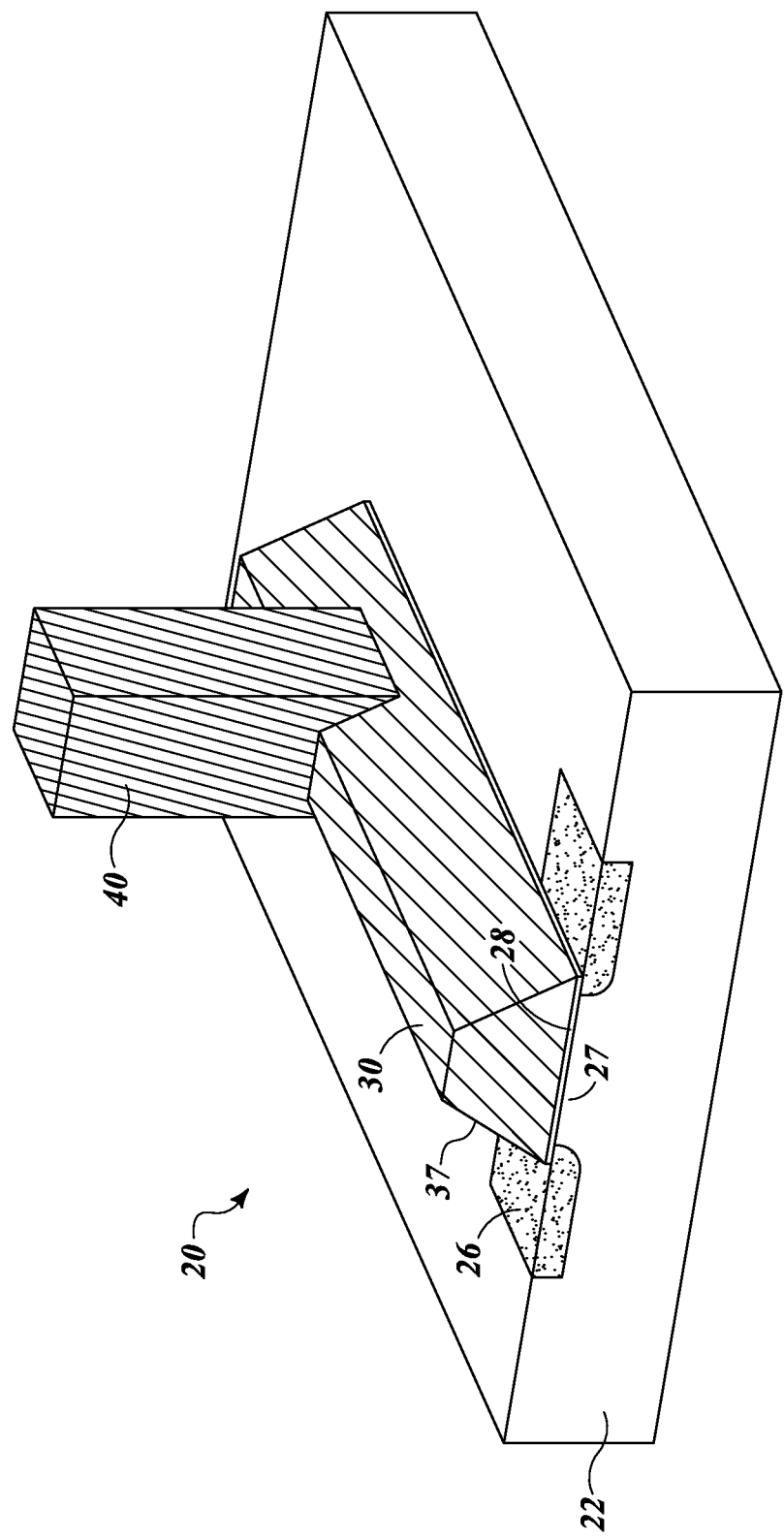
FIG. 3 is an elevated view of a strained transistor structure according to one embodiment.

FIG. 3 is an isometric view of a transistor 20 including a gate electrode 30 having sloped sidewalls 37 as described previously. The sidewall spacers 32 and the strain inducing layer 34 are not shown in FIG. 3 in order to allow a clearer depiction of the shape of the gate electrode 30 and the contact plug 40 which contacts the gate electrode 30. In practice, the sidewall spacers 32 and the strain inducing layer 34 are present, though not shown in FIG. 3. In FIG. 3 a metal contact plug 40 contacts the gate electrode 30 and electrically connected thereto. Voltages can be applied to the gate electrode 30 through the contact plug 40 to switch the transistor 20 between conducting and the nonconducting states.

In FIG. 3 the entire length of the gate electrode 30 has the cross section as shown in FIG. 2E. The contact plug 40 therefore contacts the gate electrode 30 at an area of the gate electrode 30 having sloped sidewalls 37. Because the contact plug 40 contacts the gate electrode 30 at a region of the gate electrode 30 having sloped sidewalls 37, the contact plug 40 can contact a greater surface area of the gate electrode 30 without having an increased horizontal cross section. Because a portion of the contact plug 40 is on the sloped sidewalls 37 of the gate electrode 30, an increased area of contact between the gate electrode 30 and the contact plug 40 is created. This increases the conductivity between the gate electrode 30 and the contact plug 40. Conversely, the resistance between the gate electrode 30 and the contact plug 40 is reduced. This also serves to increase the shear strength of the contact between the gate electrode and the contact plug 40. Because the shear strength is improved between the gate electrode 30 and the contact plug 40, weaker dielectric layers can be formed above the gate electrode 30 and the contact plug 40. This allows for low-k dielectrics to be used in the insulation regions between the transistor 20 and subsequent metal layers formed above the transistor 20. In FIG. 3 the contact plug 40 is shown as not extending to the bottom of the sloped sidewalls 37. However, in one embodiment the contact plug 40 extends to the bottom of the sloped sidewalls 37 of the gate electrode 30. In this way the contact plug 40 is in electrical contact with an even larger surface area of the gate electrode 30.

The contact plug 40 is, for example, a tungsten contact plug. Contact plug 40 can include barrier layers and adhesion layers to improve adhesion between the tungsten plug 40 and the gate electrode 30 as well as dielectric layers above the transistor 20 through which the plug is formed but not shown. The barrier and adhesion layers may include titanium layers, titanium nitride layers, titanium tungsten layers, or any other suitable layers. Alternatively, the contact plug 40 may be formed of a material other than tungsten. The contact plug 40 can be formed of copper, aluminum, aluminum copper, gold, or any other suitable materials.

Figure 4:
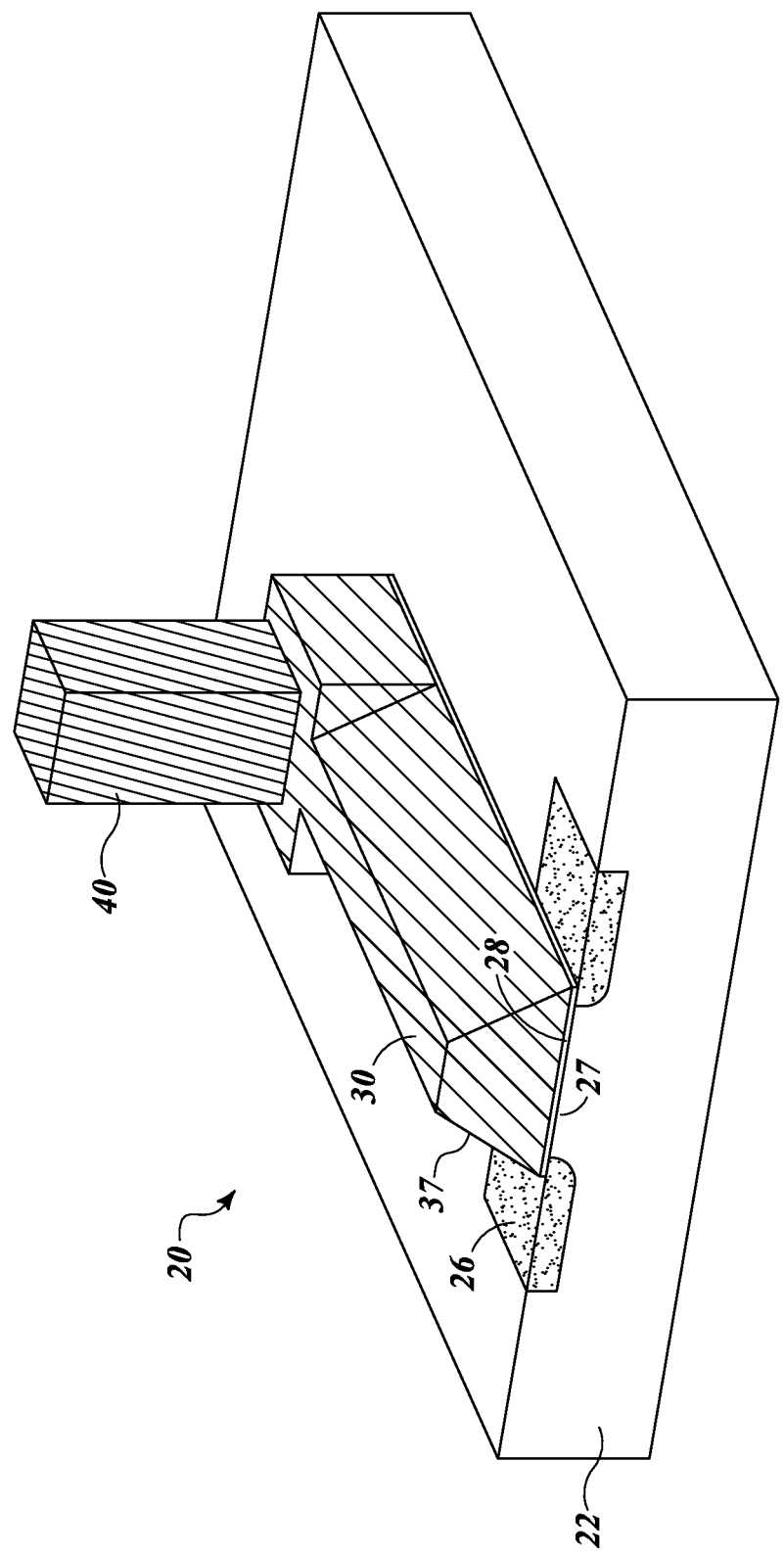
FIG. 4 is an elevated view of a strained transistor structure according a second embodiment.

FIG. 4 is an isometric view of a transistor 20 including a gate electrode 30 having sloped sidewalls 37. Differently from FIG. 3, the gate electrode 30 does not have sloped sidewalls 37 at a region where the contact plug 40 contacts the gate electrode 30. In such an embodiment, the gate electrode 30 is formed having one etch process that etches sloped sidewalls 37 into the gate electrode 30 and another process which leaves substantially vertical sidewalls at a different region of the gate electrode 30. This allows for a conventional contact plug 40 to be formed on the gate electrode 30. In FIGS. 3 and 4 the contact plugs 40 have been shown as having a square cross section. However, in practice, the cross section of the contact plug 40 can be circular or elliptical, or in any other suitable shape. While the gate electrode 30 has a same vertical height over the channel region as at a region where the contact plug 40 contacts the gate electrode 30, in practice the region of the gate electrode 30 at which the contact plug 40 contacts the gate electrode 30 can be thicker than the portions of the gate electrode that have sloped sidewalls 37. This is because when forming the sloped sidewalls 37 of the gate electrode 30, the height of the gate electrode 30 at those portions that will have sloped sidewalls 37 can be reduced due to etching. Furthermore, the gate electrode 30 may continue to extend beyond where the contact plug 40 has contacted the gate electrode 30. Oftentimes a single gate electrode 30 will overlie multiple channel regions of multiple transistors. Thus many contact plugs 40 may be formed contacting a single continuous gate electrode 30 overlying multiple transistor channel regions 27. Many other possible shapes and variations and thicknesses can be used in order to make a transistor 20 according to principles of the present disclosure. All such other shapes, thicknesses, and compositions fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device comprising:
a transistor structure including:
a channel region formed in a monocrystalline semiconductor substrate;
a source region formed at least partially in the monocrystalline semiconductor substrate adjacent the channel region;
a drain region formed at least partially in the monocrystalline semiconductor substrate adjacent the channel region;
a gate dielectric layer formed on the channel region; and
a gate electrode formed on the gate dielectric layer, the gate electrode having a conductive portion over the channel region having inwardly sloping sidewalls such that the conductive portion of the gate electrode has a bottom cross-section length that is greater than an upper portion cross-section length;
a contact plug contacting the gate electrode at a gate contact region of the gate electrode having inwardly sloping sidewalls, wherein at least part of the contact plug is on the inwardly sloping sidewalls at the gate contact region of the gate electrode; and
a strain inducing layer formed over the transistor structure.

2. The semiconductor device of claim 1 comprising a gate contact on the gate electrode at a gate contact region of the gate electrode having vertical sidewalls, the gate contact region of the gate electrode being adjacent to the conductive portion having inwardly sloping sidewalls.

3. The semiconductor device of claim 1, wherein a dopant concentration of the channel region has a gradient inversely proportional to the slope of the inwardly sloping sidewalls of the gate electrode portion over the channel region.

4. The semiconductor device of claim 1, wherein the inwardly sloping sidewalls of the gate electrode make an angle Ø in a range between 20° and 45° with respect to a vertical direction.

5. The semiconductor device of claim 1 comprising sidewall spacers including dielectric material formed on at least part of the inwardly sloping sidewalls of the gate electrode portion over the channel region.

6. The semiconductor device of claim 1,
wherein at least a base portion of the conductive portion of the gate electrode includes polysilicon;
wherein the monocrystalline semiconductor substrate includes silicon; and
wherein the strain inducing layer includes silicon nitride.

7. The semiconductor device of claim 1 wherein the transistor structure is part of an N-type transistor, and the strain inducing layer is inducing compressive strain on the transistor structure.

8. The semiconductor device of claim 1 wherein the transistor structure is part of a P-type transistor, and the strain inducing layer is inducing tensile strain on the transistor structure.

9. A semiconductor device comprising:
a transistor structure including:
a channel region formed in a monocrystalline semiconductor substrate;
a gate dielectric overlying the channel region;
a gate electrode overlying the gate dielectric, the gate electrode having a conductive portion overlying the channel region, the conductive portion of the gate electrode having a cross-section shape with a bottom side, a top side, and two sidewalls, the two sidewalls being opposite each other and extending from the bottom side to the top side, wherein each of the sidewalls is sloped inward from the bottom side to the top side at an angle of at least 20 degrees relative to a vertical direction;

a contact plug contacting the gate electrode at a gate contact region of the gate electrode having inwardly sloping sidewalls, wherein at least part of the contact plug is on the inwardly sloping sidewalls at the gate contact region of the gate electrode; and a strain inducing layer formed over the transistor structure.

10. The semiconductor device of claim 9, wherein the gate dielectric includes one or more layers of dielectric material formed directly on the channel region; and wherein the gate electrode includes doped polysilicon formed directly on the gate dielectric.

* * * * *